United States Patent
Luo et al.

(10) Patent No.: US 10,756,051 B2
(45) Date of Patent: Aug. 25, 2020

(54) WAFER-LEVEL SYSTEM PACKAGING METHOD AND PACKAGE STRUCTURE

(71) Applicant: Ningbo Semiconductor International Corporation, Ningbo (CN)

(72) Inventors: Hailong Luo, Ningbo (CN); Clifford Ian Drowley, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/229,360

(22) Filed: Dec. 21, 2018

(65) Prior Publication Data

US 2020/0075538 A1 Mar. 5, 2020

Related U.S. Application Data

(63) Continuation of application No. PCT/CN2018/113100, filed on Oct. 31, 2018.

(30) Foreign Application Priority Data

Sep. 4, 2018 (CN) .......................... 2018 1 1026717

(51) Int. Cl.
*H01L 23/52* (2006.01)
*H01L 23/00* (2006.01)
(Continued)

(52) U.S. Cl.
CPC ............ *H01L 24/94* (2013.01); *H01L 21/561* (2013.01); *H01L 21/565* (2013.01);
(Continued)

(58) Field of Classification Search
CPC . H01L 21/561; H01L 21/565; H01L 23/3121; H01L 24/94; H01L 24/80; H01L 24/08; H01L 25/50; H01L 25/0652
(Continued)

(56) References Cited

U.S. PATENT DOCUMENTS 8,535,989 B2 * 9/2013 Sankman ............ H01L 21/6835
438/127
2008/0169548 A1 7/2008 Baek
(Continued)

FOREIGN PATENT DOCUMENTS

CN 101241902 A 8/2008
CN 102569275 A 7/2012
(Continued)

*Primary Examiner* — Luan C Thai
(74) *Attorney, Agent, or Firm* — Anova Law Group, PLLC

(57) ABSTRACT

The present disclosure provides a wafer-level packaging method and a package structure. The wafer-level packaging method includes: providing a device wafer that contains a plurality of first chips, that each first chip contains a first electrode exposed at a wafer front surface of the device wafer; providing a plurality of second chips, that each second chip contains a second electrode exposed at a chip front surface of the each second chip, and a surface opposite to the chip front surface is a chip back surface; bonding the chip back surface of the each second chip to a portion of the wafer front surface of the device wafer between adjacent first chips of the plurality of first chips; forming insulating sidewalls on sidewalls of the plurality of second chips; and forming a conductive layer conformally covering the chip front surface, each insulating sidewall, and the wafer front surface.

20 Claims, 4 Drawing Sheets

(51) Int. Cl.
*H01L 21/56* (2006.01)
*H01L 23/31* (2006.01)
*H01L 25/065* (2006.01)
*H01L 25/00* (2006.01)

(52) U.S. Cl.
CPC .......... *H01L 23/3121* (2013.01); *H01L 24/08* (2013.01); *H01L 24/80* (2013.01); *H01L 25/0652* (2013.01); *H01L 25/50* (2013.01); *H01L 2224/08145* (2013.01); *H01L 2224/80894* (2013.01); *H01L 2225/06524* (2013.01); *H01L 2225/06582* (2013.01)

(58) Field of Classification Search
USPC ........................................................ 257/777
See application file for complete search history.

(56) References Cited

U.S. PATENT DOCUMENTS

| | | | |
|---|---|---|---|
| 2008/0224306 A1* | 9/2008 | Yang | ........................ H01L 24/24 257/725 |
| 2010/0013077 A1* | 1/2010 | Shin | .................... H01L 23/3192 257/690 |
| 2011/0042819 A1 | 2/2011 | Wen et al. | |
| 2011/0079912 A1 | 4/2011 | Marcoux | |

FOREIGN PATENT DOCUMENTS

| CN | 204497228 U | 7/2015 |
|---|---|---|
| CN | 106783748 A | 5/2017 |

* cited by examiner

WAFER-LEVEL SYSTEM PACKAGING METHOD AND PACKAGE STRUCTURE

CROSS-REFERENCES TO RELATED APPLICATIONS

This application is a continuation application of PCT Patent Application No. PCT/CN 2018/113100, filed on Oct. 31, 2018, which claims priority to Chinese patent application No. 201811026717.8, filed on Sep. 4, 2018, the entirety of all of which is incorporated herein by reference.

FIELD OF THE DISCLOSURE

The present disclosure relates to the field of semiconductor technologies and, in particular, to a wafer-level packaging method and a package structure.

BACKGROUND

With the development trend of ultra-large scale integrated circuits, the feature size of integrated circuits continues to decrease, and the requirements for packaging technology of integrated circuits are correspondingly increasing. Existing packaging technologies involve ball grid array (BGA), chip scale package (CSP), wafer-level package (WLP), 3D package (3D) and system in package (System in Package, SiP), etc.

At present, to meet the goal for lower cost, more reliability, and faster and higher density of integrated circuit packaging, advanced packaging methods mainly use wafer-level system-in-package (WLSiP). Compared with the conventional SiP, the WLSiP completes the packaging integration process on a wafer, which has the advantages of greatly reducing the area of the package structure, reducing the manufacturing cost, optimizing the electrical performance, batch manufacturing, etc., therefore can significantly reduce workload and needs for equipment.

The WLSiP mainly includes two important processes: physical connection and electrical connection. For example, a bonding process is used to realize the physical connection between chips to be integrated and a wafer, the electrical connection between semiconductor devices is realized by an electroplating technology, and the electrical connection between the chips and an external circuit is realized through through-silicon via (TSV).

However, the electrical connections in current WLSiP needs to be simplified.

BRIEF SUMMARY OF THE DISCLOSURE

The present disclosure provides a wafer-level packaging method and a wafer-level package structure. The packaging process is simplified.

One aspect of the present disclosure provides a wafer-level packaging method, including: providing a device wafer that contains a plurality of first chips, that each first chip contains a first electrode, and the first electrode is exposed at a wafer front surface of the device wafer; providing a plurality of second chips, that each second chip contains a second electrode, the second electrode is exposed at a chip front surface of the each second chip, and a surface opposite to the chip front surface is a chip back surface; bonding the chip back surface of the each second chip to a portion of the wafer front surface of the device wafer between adjacent first chips of the plurality of first chips; forming insulating sidewalls on sidewalls of the plurality of second chips; and forming a conductive layer conformally covering the chip front surface, each insulating sidewall, and the wafer front surface.

Another aspect of the present disclosure provides a wafer-level package structure, including: a device wafer that contains a plurality of first chips, that each first chip contains a first electrode, and the first electrode is exposed at a wafer front surface of the device wafer; a plurality of second chips, bonded to the wafer front surface, that a chip back surface of each second chip is bonded to a portion of the wafer front surface between adjacent first chips of the plurality of first chips, a surface opposite to the chip back surface is a chip front surface, and the each second chip contains a second electrode exposed at the chip front surface; insulating sidewalls on sidewalls of the plurality of second chips; and a conductive layer conformally covering the chip front surface, each insulating sidewall, and the wafer front surface.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
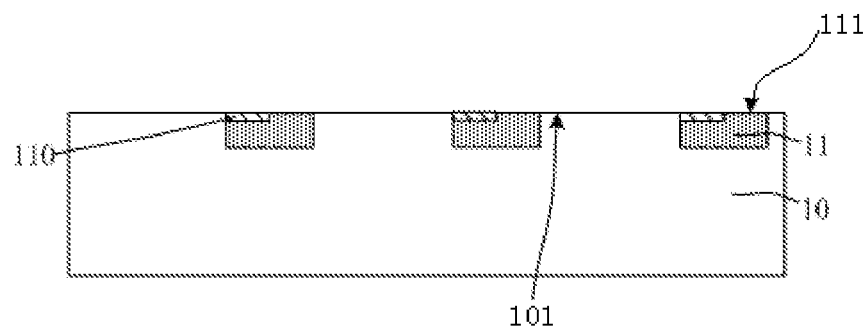
FIGS. 1-4 illustrate schematic cross-sectional views of structures corresponding to certain stages during an exemplary wafer-level packaging method according to some embodiments of the present disclosure.

Packaging methods and structures are complicated. For example, after bare chips to be integrated are bonded to a wafer, it is needed to form a first connection structure connected to the bare chips, a second connection structure connected to chips formed in the wafer, and an interconnection structure connected to the first connection structure and the second connection structure. Such process is complicated.

The present disclosure provides a wafer-level packaging method, including: providing a device wafer that contains a plurality of first chips, that each first chip contains a first electrode, the first electrode is exposed at the device wafer, and a surface of the device wafer exposing the first electrode is a wafer front surface; providing a plurality of second chips, that each second chip includes a second electrode, the second electrode is exposed at the each second chip, a surface of the each second chip exposing the second electrode is a chip front surface, and a surface opposite to the chip front surface is a chip back surface; bonding the chip back surface of the each second chip to a portion of the wafer front surface of the device wafer between adjacent first chips of the plurality of first chips; forming insulating sidewalls on sidewalls of the plurality of second chips; and forming a conductive layer conformally covering the chip front surface, each insulating sidewall, and the wafer front surface.

The present disclosure forms the insulating sidewalls on the sidewalls of the plurality of second chips, before forming the conductive layer conformally covering the chip front surface, the each insulating sidewall and the wafer front surface. The conductive layer covers the chip front surface and is in contact with the second electrode exposed at the chip front surface. The conductive layer also covers the wafer front surface and is in contact with the first electrode exposed at the wafer front surface. The present disclosure uses the conductive layer to realize electrical connection between the first electrode and the second electrode, thereby achieving electrical connection between the plurality of first chips and the plurality of second chips. The process is simple. Further, the conductive layer also covers the each insulation sidewall of the plurality of second chips, thereby achieving insulation between the conductive layer and the sidewalls of the plurality of second chips. The insulating sidewalls insulate the conductive layer and the plurality of second chips, thereby avoiding the impact of the conductive layer to the performance of the plurality of second chips.

To make the above described objects, features and advantages of the present disclosure easier to be understood, specific embodiments of the present disclosure are described in detail below with reference to the accompanying drawings.

FIGS. 1-4 illustrate schematic cross-sectional views of structures corresponding to certain stages during an exemplary wafer-level packaging method according to some embodiments of the present disclosure. The wafer-level packaging method of one embodiment includes the following steps.

As shown in FIG. 1, a device wafer 10 is provided. The device wafer 10 includes a plurality of first chips 11. Each first chip 11 contains a first electrode 110 and the first electrode 110 is exposed at the device wafer 10. A surface of the device wafer 10 exposing the first electrode 110 is a wafer front surface 101.

For example, the device wafer 10 is a CMOS Wafer to be fabricated. In some embodiments, the semiconductor substrate of the device wafer 10 is a silicon substrate. In other embodiments, the material of the semiconductor substrate may also be other materials, such as germanium, silicon germanium, silicon carbide, gallium arsenide, and/or indium gallium. In other embodiments, the semiconductor substrate can also be other types of substrates such as a silicon substrate on an insulator and a germanium substrate on an insulator. The material of the semiconductor substrate may be a material suitable for the needs of the semiconductor process or may be easy to integrate. The device wafer 10 has a thickness of about 10 micrometers to about 100 micrometers, according to actual process requirements.

For example, the plurality of first chips 11 formed in the device wafer 10 may be the same type or different types of chips. The device wafer 10 can be fabricated by using an integrated circuit fabrication technique. For example, devices, such as N-type metal oxide semiconductor (N-Metal-Oxide-Semiconductor, NMOS) devices and P-type Metal Oxide-Semiconductor (P-Metal-Oxide-Semiconductor, PMOS) devices, may be formed on a semiconductor substrate by processes such as a deposition, an etching, etc., and structures, such as a dielectric layer, a metal interconnection structure, and a pad electrically connected to the metal interconnection, may be formed on the devices, to integrate the plurality of first chips 11 in the device wafer 10.

For example, the first electrode 110 formed on a surface of the each first chip 11 is used to realize electrical connection of the plurality of first chips 11 with other semiconductor devices. For example, the first electrode 110 may be a lead pad.

Figure 2:
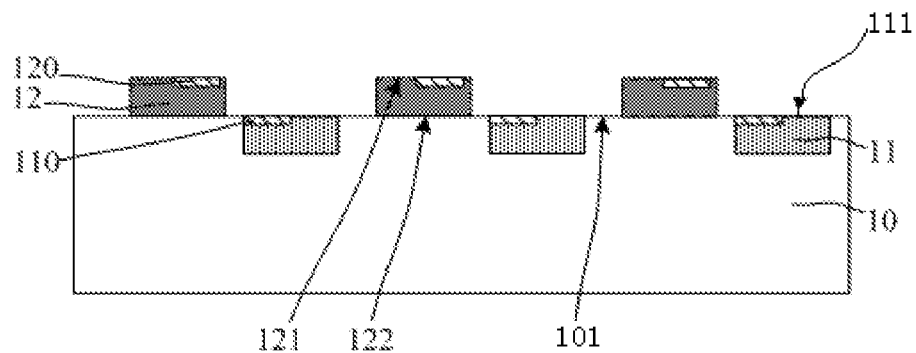

As shown in FIG. 2, a plurality of second chips 12 are provided, each second chip 12 contains a second electrode 120, and the second electrode 120 is exposed at the each second chip 12. A surface of the each second chip 12 exposing the second electrode 120 is a chip front surface 121, and a surface opposite to the chip front surface 121 is a chip back surface 122.

For example, the plurality of second chips 12 is used as chips to be integrated in a wafer-level system-in-package (WLSiP).

The wafer-level system packaging method according to one embodiment of the present disclosure is used to implement heterogeneous integration. Accordingly, the plurality of second chips 12 may be chips made of silicon wafers, or may be chips formed of other materials.

The number of the plurality of second chips 12 is at least one, and when the number of the plurality of second chips 12 is two or more, the functions of the plurality of second chips 12 may be the same or different. The plurality of second chips 12 can be fabricated by using an integrated circuit fabrication technology, and can be memory chips, communication chips, processors, or logic chips. The plurality of second chips 12 includes devices such as NMOS devices or PMOS devices formed on a semiconductor substrate.

For example, the second electrode 120 formed on the chip front surface of the each second chip 12 is used to achieve electrical connection between the plurality of second chips 12 and other semiconductor devices. For example, the second electrode 120 may be a lead pad.

Figure 3:
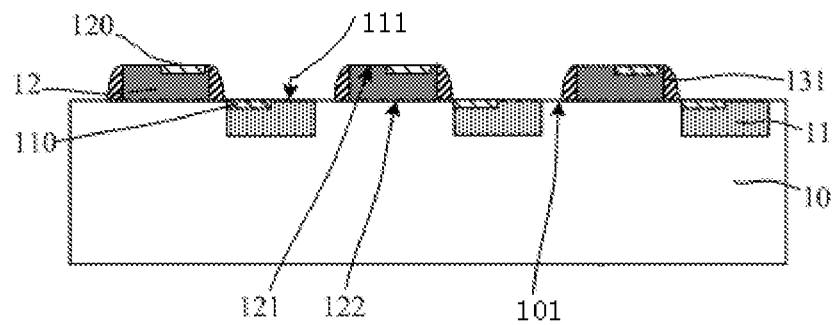

With continued reference to FIG. 3, the chip back surface 122 of the each second chip 12 is bonded to the wafer front surface 101 between adjacent first chips of the plurality of first chips 11.

For example, the plurality of second chips 12 bonded to the device wafer 10 and the plurality of first chips 11 formed in the device wafer 10 are staggered from each other, that is, the projections of the plurality of first chips 11 and the plurality of second chips 12 on the device wafer 10 do not coincide. Thus, when a conformal covering conductive layer is formed, the conductive layer can cover the plurality of second chips 12 and the plurality of first chips 11 on the device wafer 10.

For example, a bonding of the plurality of second chips 12 and the device wafer 10 may be achieved by an adhesive bonding, a glass dielectric bonding, etc.

As shown in FIG. 3, insulating sidewalls 131 are formed on sidewalls of the plurality of second chips 12.

For example, forming the insulating sidewalls 131 on the sidewalls of the plurality of second chips 12 includes: forming an insulating layer conformally covering the plurality of second chips 12 and the wafer front surface 101 exposed between the plurality of second chips 12; and removing the insulating layer on the chip front surface 121 of the each second chip 12 and on a chip front surface 111 of the each first chip 11, and retaining the insulating layer on the sidewalls of the plurality of second chips 12 to constitute the insulating sidewalls 131.

In one embodiment, the insulating sidewalls 131 completely expose the first electrode 110 and the second electrode 120. That is, the insulating sidewalls 131 do not block the first electrode 110 on the each first chip 11 on the wafer front side 101, and do not cover the second electrode 120 on the each second chip 12. This can increase contact area of a subsequent conductive layer with the first electrode 110 and the second electrode 120, thereby increasing the reliability of the electrical connection.

In other embodiments, the insulating sidewalls may partially block the first electrode or partially cover the second electrode, as long as the conductive layer can be in contact with the first electrode and the second electrode to implement electrical connection of the first electrode and the second electrode.

For example, forming the insulating layer that conformally covers the plurality of second chips 12 and the wafer front surface 101 exposed between the plurality of second chips 12 includes forming the insulating layer by a chemical vapor deposition method.

It should be noted that if a thickness of the insulating layer is too large, the thickness of the corresponding insulating sidewalls 131 is too large, which may easily block the plurality of first chips 11 or increase the volume of the package structure; and if the thickness of the insulating layer is too small, the thickness of the corresponding insulating sidewalls 131 is too small, the insulation between the conductive layer and the plurality of second chips 12 is easily affected. Therefore, forming the insulating layer conformally covering the plurality of second chips 12 and the wafer front surface 101 exposed between the plurality of second chips 12 includes: the thickness of the insulating layer is between about 0.1 micrometers and about 5 micrometers.

For example, forming the insulating layer conformally covering the plurality of second chips 12 and the wafer front surface 101 exposed between the plurality of second chips 12 includes: the insulating layer is made of a material including one of silicon nitride, silicon oxide, and silicon oxynitride.

For example, removing the insulating layer on the chip front surface 121 of the each second chip 12 and on the chip front surface 111 of the each first chip 11 includes: removing the insulating layer on the chip front surface 121 of the second chip 12 and on the chip front surface 111 of the each first chip 11 by a dry etching.

Figure 4:
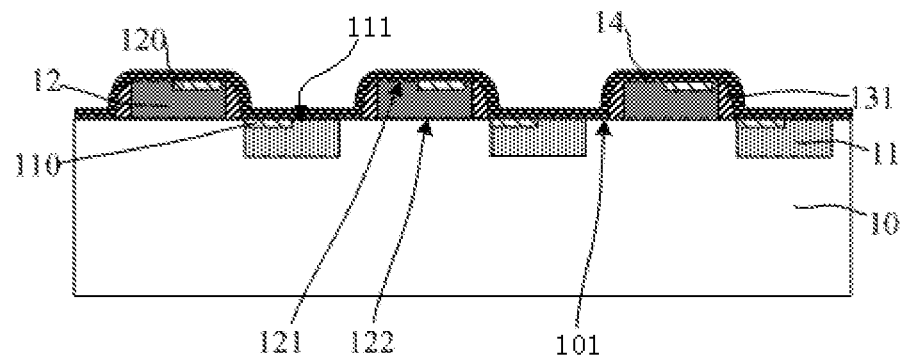

As shown in FIG. 4, a conductive layer 14, conformally covering the chip front surface 121, each insulating sidewall 131, and the wafer front surface 101, is formed.

For example, forming the conductive layer 14 conformally covering the chip front surface 121, the each insulating sidewall 131, and the wafer front surface 101 includes: forming the conductive layer 14 by a chemical vapor deposition method.

It should be noted that if a thickness of the conductive layer 14 is too small, the covering is insufficient, and the electrical connection is easily affected; and if the thickness of the conductive layer 14 is too large, bridging between the conductive layers 14 on the plurality of second chips 12 is likely to occur. Therefore, the thickness of the conductive layer 14 is between about 0.1 micrometers and about 5 micrometers.

For example, the conductive layer 14 is made of one or more of materials including copper, aluminum, tin, and nickel.

As shown in FIG. 4, the exemplary wafer-level packaging method further includes covering the conductive layer 14 with an encapsulation layer (not shown) after forming the conductive layer 14.

The encapsulation layer can function as an insulation, a seal, and a moisture barrier, and can reduce the probability that the plurality of first chips 11 and the plurality of second chips 12 are damaged, contaminated or oxidized, thereby facilitating optimization of the performance of the obtained package structure.

FIGS. 5-10 illustrate schematic cross-sectional views of structures corresponding to certain stages during another exemplary wafer-level packaging method according to some embodiments of the present disclosure.

One embodiment differs from the previous embodiments in the step of bonding a plurality of second chips 200 to a device wafer 300.

Figure 5:
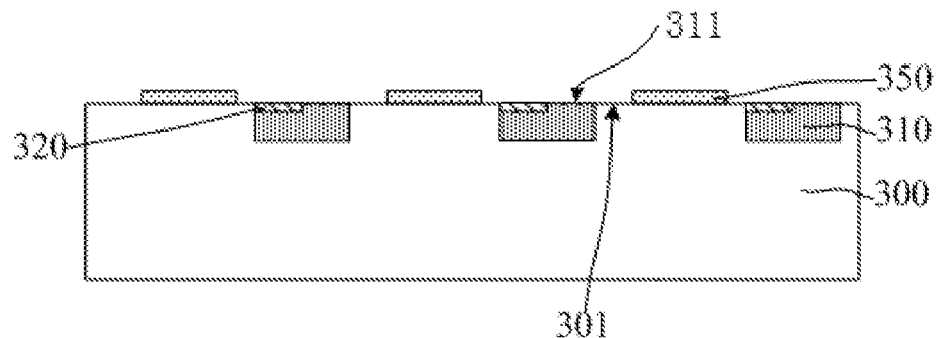
FIGS. 5-10 illustrate schematic cross-sectional views of structures corresponding to certain stages during another exemplary wafer-level packaging method according to some embodiments of the present disclosure.

As shown in FIG. 5, the device wafer 300 is provided. The device wafer 300 includes a plurality of first chips 310, each first chip 310 includes a first electrode 320, and the first electrode 320 is exposed at the device wafer 300. A surface of the device wafer 300 exposing the first electrode 320 is a wafer front surface 301 and a first dielectric layer 350 is formed on the wafer front surface 301 between adjacent first chips 310 of the plurality of first chips 310.

The first dielectric layer 350 is used to implement bonding between the device wafer 300 and the plurality of second chips 200. In one embodiment, the first dielectric layer 350 is spaced apart from the plurality of first chips 310 and corresponds to positions of the plurality of second chips 200 to be bonded.

For example, the first dielectric layer 350 is used to achieve bonding of the device wafer 300 and the plurality of second chips 200 by a fusion bonding.

The material of the first dielectric layer 350 in one embodiment is silicon oxide. Alternatively, the material of the first dielectric layer 350 may also be other oxide materials.

The dielectric layer material may be overlaid on the wafer front surface 301 of the device wafer 300 by a chemical vapor deposition process, after which a patterning process (such as a photolithography and an etching) is performed on the dielectric layer material, to form the first dielectric layer 350 on the wafer front surface 301 of the device wafer 300, between the adjacent first chips 310.

Figure 6:
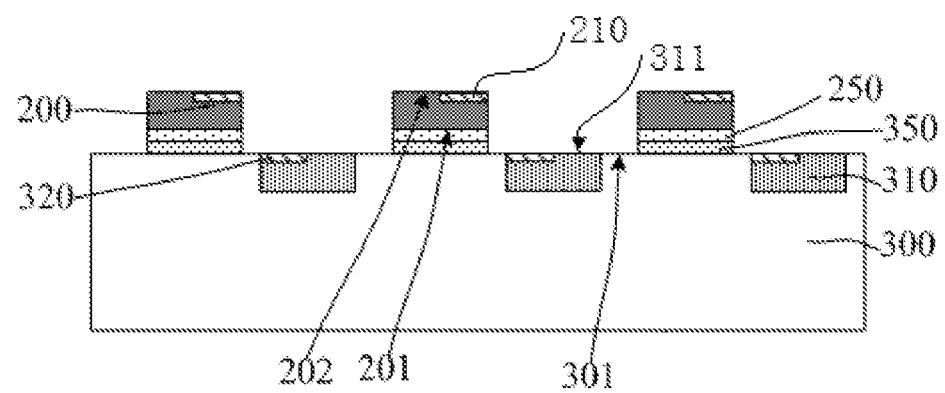

As shown in FIG. 6, the plurality of second chips 200 are provided, each second chip 200 includes a second electrode 210, and the second electrode 210 is exposed at the each second chip 200. A surface of the each second chip 200 exposing the second electrode 210 is a chip front surface 202, and a surface of the each second chip 200 opposite to the chip front surface 202 is a chip back surface 201. The chip back surface 201 is formed with a second dielectric layer 250.

The second dielectric layer 250 is used to implement bonding between the plurality of second chips 200 and the device wafer 300.

For example, the second dielectric layer 250 is used to achieve bonding of the device wafer 300 and the plurality of second chips 200 by a fusion bonding.

The material of the second dielectric layer 250 in one embodiment is silicon oxide. Alternatively, the material of the second dielectric layer 250 may also be other oxide materials.

Silicon oxide may be formed on the chip back surface 201 of the each second chip 200 by a thermal oxidation process.

In one embodiment, the first dielectric layer 350 and the second dielectric layer 250 facilitate bonding the wafer front surface 301 to the chip back surface 201 of the each second chip 200 to be integrated, thereby implementing physical connection between the wafer 300 and the plurality of second chips 200.

For example, bonding the chip back surface 201 of the each second chip 200 to the wafer front side 301 exposed between the plurality of first chips 310 includes: disposing oppositely and bonding the first dielectric layer 350 and the second dielectric layer 250, to bond the plurality of second chips 200 with the device wafer 300.

In one embodiment, the bonding of the first dielectric layer 350 and the second dielectric layer 250 is a fusion bonding.

A fusion bonding is a process of performing bonding mainly by using interfacial chemical force. In the fusion bounding, a covalent bond is formed at contact surfaces of the first dielectric layer 350 and the second dielectric layer 250, and a bonding is achieved by the covalent bond. The bonding strength between the first dielectric layer 350 and the second dielectric layer 250 is strong, thereby improving the bonding strength between the device wafer 300 and the plurality of second chips 200, and the subsequent process has less influence on the bonding strength, correspondingly improving the package yield of the wafer-level system package. Moreover, by using a low-temperature fusion bonding process, the process temperature of the annealing process in the fusion bonding process is reasonably reduced, thereby reducing the influence of the fusion bonding process on other film layers.

For example, the fusion bonding process includes: performing a plasma activation treatment on the surfaces of the first dielectric layer 350 and the second dielectric layer 250, and dampening and drying the deionized water. After the plasma activation process, the first dielectric layer 350 and the second dielectric layer 250 are oppositely disposed and attached, according to a preset relative positional relationship between the device wafer 300 and the plurality of second chips 200. A bonding pressure is applied on the device wafer 300 and the plurality of second chips 200 to perform a pre-bonding process.

The fusion bonding process further includes: annealing the device wafer 300 and the plurality of second chips 200 after the pre-bonding process.

Figure 7:
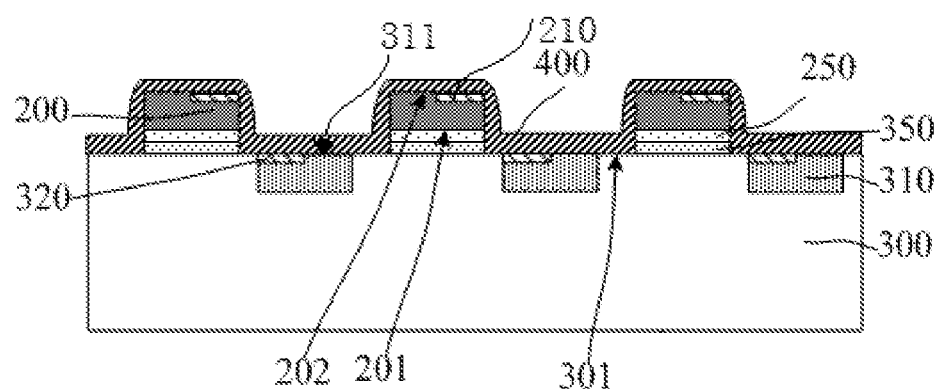
Figure 8:
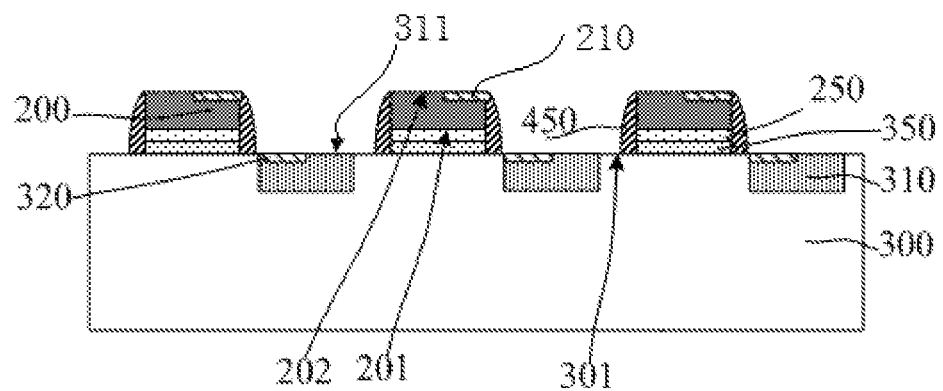

As shown in FIGS. 7 to 8, insulating sidewalls 450 are formed on sidewalls of the plurality of second chips 200.

For example, forming the insulating sidewalls 450 on the sidewalls of the plurality of second chips 200 includes: forming an insulating layer 400 conformally covering the plurality of second chips 200 and the wafer front surface 301 exposed between the plurality of second chips 200.

In one embodiment, the insulating layer 400 further covers the first dielectric layer 350 and the second dielectric layer 250.

The insulating layer 400 on the chip front surface 202 of the each second chip 200 and on a chip front surface 311 of the each first chip 310 is removed, and the insulating layer 400 on the sidewalls of the plurality of second chips 200 is retained to constitutes the insulating sidewalls 450. The insulating sidewalls 450 completely expose the first electrode 320 and the second electrode 210.

In one embodiment, the insulating sidewalls 450 further cover the sidewalls of the first dielectric layer 350 and the second dielectric layer 250 that are disposed oppositely to each other.

Figure 9:
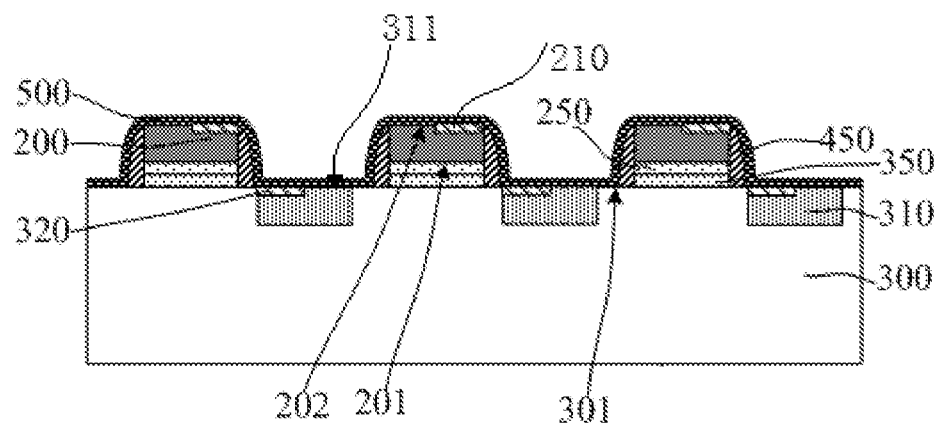

As shown in FIG. 9, a conductive layer 500 is formed to conformally cover the chip front surface 311 of the each first chip 310, the chip front surface 202 of the each second chip 200, each insulating sidewall 450, and the wafer front surface 301.

The conductive layer 500 covers the chip front surface 202 of the each second chip 200 and is in contact with the second electrode 210 exposed at the chip front surface 202 of the each second chip 200. The conductive layer 500 also covers the wafer front surface 301 and is in contact with the first electrode 320 exposed at the wafer front surface 301. In one embodiment, the electrical connection between the first electrode 320 and the second electrode 210 is realized by the conductive layer 500, thereby achieving electrical connection between the plurality of first chips 310 and the plurality of first chips 200, and the process is simple.

For example, forming the conductive layer 500 conformally covering the chip front surface 311 of the each first chip 310, the chip front surface 202 of the each second chip 200, the each insulating sidewall 450, and the wafer front surface 301, includes: forming the conductive layer 500 by a chemical vapor deposition method, and a thickness of the conductive layer 500 is between about 0.1 micrometers to about 5 micrometers.

For example, the conductive layer 500 is made of one or more of materials including copper, aluminum, tin, and nickel.

Figure 10:
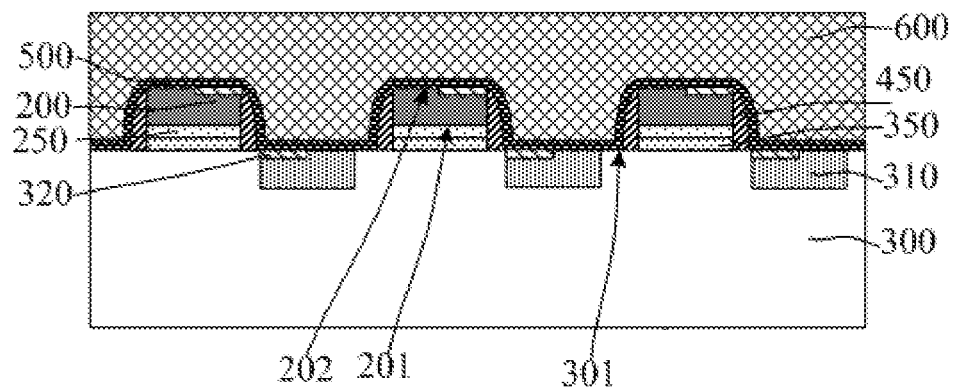

As shown in FIG. 10, the packaging method further includes: covering an encapsulation layer 600 on the conductive layer 500 after forming the conductive layer 500.

For example, the encapsulation layer 600 is made of a material including one of a polymer and a dielectric.

In one embodiment, forming the encapsulation layer 600 includes: forming the encapsulation layer 600 by an injection molding process. The filling performance of the injection molding process is better, and the encapsulation layer 600 can have good insulation and sealing effects on the plurality of first chips 310 and the plurality of second chips 200.

In one embodiment, the material of the encapsulation layer 600 is epoxy resin (Epoxy). Epoxy resin has the advantages of low shrinkage, good adhesion, good corrosion resistance, excellent electrical properties and low cost, so it is widely used as a packaging material for electronic devices and integrated circuits. In other embodiments, the material of the encapsulation layer may also be a thermosetting material such as one of polyimide and silica gel, or the encapsulation layer may also be a dielectric material such as one of aluminum oxide and aluminum nitride.

The present disclosure also provides a wafer-level package structure. Referring to FIG. 4, a schematic cross-sectional view of an exemplary wafer-level package structure according to one exemplary embodiment of the present disclosure is shown.

The exemplary wafer-level package structure includes: a device wafer 10, that the device wafer 10 contains a plurality of first chips 11, each first chips 11 contains a first electrode 110, and the first electrode 110 is exposed at the device wafer 10. A surface of the device wafer 10 exposing the first electrode 110 is a wafer front surface 101.

For example, the device wafer 10 is a CMOS Wafer to be fabricated. In some embodiments, the semiconductor substrate of the device wafer 10 is a silicon substrate. In other embodiments, the material of the semiconductor substrate may also be other materials, such as germanium, silicon germanium, silicon carbide, gallium arsenide, an/or indium gallium. In other embodiments, the semiconductor substrate can also be other types of substrates such as one of a silicon substrate on an insulator and a germanium substrate on an insulator. The material of the semiconductor substrate may be a material suitable for the needs of the semiconductor process or may be easy to integrate. The device wafer 10 has a thickness of about 10 micrometers to about 100 micrometers, according to actual process requirements.

For example, the plurality of first chips 11 formed in the device wafer 10 may be the same type or different types of chips. The device wafer 10 can be fabricated by using an integrated circuit fabrication technique. For example, devices, such as N-type metal oxide semiconductor (N-Metal-Oxide-Semiconductor, NMOS) devices and P-type Metal Oxide-Semiconductor (P-Metal-Oxide-Semiconductor, PMOS) devices, may be formed on a semiconductor substrate by processes such as a deposition, an etching, etc., and structures, such as a dielectric layer, a metal interconnection structure, and a pad electrically connected to the metal interconnection on the devices, may be formed to integrate a plurality of first chips 11 in the device wafer 10.

For example, the first electrode 110 formed on a surface of the each first chip 11 is used to realize electrical connection of the plurality of first chips 11 with other semiconductor devices. For example, the first electrode 110 may be a lead pad.

A plurality of second chips 12 is bonded to the wafer front surface 101. A surface of each second chip 12 bonded to the wafer front surface 101 is a chip back surface 122, and a surface opposite to the chip back surface 122 of the each second chips 12 is a chip front surface 121. The each second chip 12 includes a second electrode 120, exposed at the chip front surface 121 of the each second chip 12.

For example, the plurality of second chips 12 is used as chips to be integrated in a wafer-level system-in-package (WLSiP).

In one embodiment, the package structure is heterogeneously integrated. Correspondingly, the plurality of second chips 12 may be chips made of silicon wafers, or may be chips formed by other materials.

The number of the plurality of second chips 12 is at least one, and when the number of the plurality of second chips 12 is two or more, the functions of the plurality of second chips 12 may be the same or different. The plurality of second chips 12 can be fabricated by using an integrated circuit manufacturing technology, and can be memory chips, communication chips, processors, or logic chips. The plurality of second chips 12 includes devices such as NMOS devices or PMOS devices formed on a semiconductor substrate.

In one embodiment, the plurality of second chips 12 is bonded on the wafer front surface 101 between adjacent first chips 11 of the plurality of first chips 11. For example, the plurality of second chips 12 bonded to the device wafer 10 and the plurality of first chips 11 in the device wafer 10 are staggered from each other, that is, the projections of the plurality of first chips 11 and the plurality of second chips 12 on the device wafer 10 do not coincide. Thus, when an insulating layer conformally covers the bonding structure, the insulating layer can cover the plurality of first chips 11 and the plurality of second chips 12.

For example, the second electrode 120 exposed at the chip front surface 121 of the each second chip 12 is used to achieve electrical connection between the plurality of second chips 12 and other semiconductor devices. For example, the second electrode 120 may be a lead pad.

For example, the plurality of second chips 12 is bonded to the device wafer 10 by one of an adhesive bonding and a glass dielectric bonding.

Insulating sidewalls 131 are formed on sidewalls of the plurality of second chips 12 for functioning to insulate the sidewalls of the plurality of second chips 12 from other devices.

The material of the insulating sidewalls 131 is an insulating material such as one of silicon nitride, silicon oxide, and silicon oxynitride.

If a thickness of the insulating sidewalls 131 is too large, it is easy to block the plurality of first chips or increase the volume of the package structure, and if the thickness of the insulating sidewalls 131 is too small, the insulation between a conductive layer 14 and the plurality of second chips 12 is easily affected. Therefore, the thickness of the insulating sidewalls 131 is between about 0.1 micrometers and about 5 micrometers.

The conductive layer 14 conformally covers the chip front surface 121, each insulating sidewall 131, and the wafer front surface 101. The conductive layer 14 covers the chip front surface 121 and is in contact with the second electrode 120 exposed at the chip front surface 121. The conductive layer 14 also covers the wafer front surface 101 and is in contact with the first electrode exposed at the wafer front surface 101. In one embodiment, the electrical connection between the first electrode 110 and the second electrode 120 is realized by the conductive layer 14, thereby achieving electrical connection between the plurality of first chips 11 and the plurality of second chips 12, and the process is simple.

For example, a thickness of the conductive layer 14 is between about 0.1 micrometers to about 5 micrometers.

For example, the conductive layer 14 is made of one or more of materials including copper, aluminum, tin, and nickel.

The package structure also includes an encapsulation layer on the conductive layer 14.

For example, the encapsulation layer can function as an insulation, a seal, and a moisture barrier, and can reduce the probability that the plurality of first chips 11 and the plurality of second chips 12 are damaged, contaminated or oxidized, thereby facilitating optimization of the performance of the obtained package structure.

For example, the encapsulation layer may be made of a material including one of a polymer and a dielectric.

In one embodiment, the material of the encapsulation layer is epoxy resin (Epoxy). Epoxy resin has the advantages of low shrinkage, good adhesion, good corrosion resistance, excellent electrical properties and low cost, so it is widely used as a packaging material for electronic devices and integrated circuits. In other embodiments, the material of the encapsulation layer may also be a thermosetting material such as one of polyimide and silica gel, or the encapsulation layer may also be a dielectric material such as one of aluminum oxide and aluminum nitride.

Referring to FIG. 10, a schematic cross-sectional view of another exemplary wafer-level package structure according to some embodiments of the present disclosure is also shown. Similar/same structure of one embodiment as that of the previous embodiment are not described redundantly. The difference between the wafer-level package structure of one embodiment and that of the previous embodiment is described below.

The structure further includes: a first dielectric layer 350 on a wafer front surface between adjacent first chips 310 of a plurality of first chips 310. A second dielectric layer 250 on a chip back surface of each second chip of a plurality of second chips 200 is oppositely bonded to the first dielectric layer 350.

The first dielectric layer 350 and the second dielectric layer 250 are oppositely disposed and bonded to realize physical connection between a device wafer 300 and the plurality of second chips 200.

In one embodiment, the bonding of the first dielectric layer 350 and the second dielectric layer 250 is a fusion bonding.

For example, the material of the first dielectric layer 350 is silicon oxide. Alternatively, the material of the first dielectric layer 350 may also be other oxide materials.

For example, the material of the second dielectric layer 250 is silicon oxide. Alternatively, the material of the second dielectric layer 250 may also be other oxide materials.

As disclosed, the technical solution of the present disclosure has the following advantages.

The present disclosure forms the insulating sidewalls on the sidewalls of the plurality of second chips, before forming the conductive layer conformally covering the chip front surface, the each insulating sidewall and the wafer front surface. The conductive layer covers the chip front surface and is in contact with the second electrode exposed at the chip front surface. The conductive layer also covers the wafer front surface and is in contact with the first electrode exposed at the wafer front surface. The present disclosure uses the conductive layer to realize the electrical connection between the first electrode and the second electrode, thereby achieving the electrical connection between the plurality of first chips and the plurality of second chips. The process is simple. Further, the conductive layer also covers the each insulation sidewall of the plurality of second chips, thereby achieving insulation between the conductive layer and the sidewalls of the plurality of second chips. The insulating sidewalls insulate the conductive layer and the plurality of second chips, thereby avoiding the impact of the conductive layer to the performance of the plurality of second chips.

Although the present disclosure has been disclosed above, the present disclosure is not limited thereto. Any changes and modifications may be made by those skilled in the art without departing from the spirit and scope of the disclosure, and the scope of the disclosure should be determined by the scope of the claims.

What is claimed is:

1. A wafer-level packaging method, comprising:
   providing a device wafer that contains a plurality of first chips, wherein each first chip contains a first electrode, and the first electrode is exposed at a wafer front surface of the device wafer;
   providing a plurality of second chips, wherein each second chip contains a second electrode, the second electrode is exposed at a chip front surface of the each second chip, and a surface opposite to the chip front surface is a chip back surface;
   bonding the chip back surface of the each second chip to a portion of the wafer front surface of the device wafer between adjacent first chips of the plurality of first chips;
   forming insulating sidewalls on sidewalls of the plurality of second chips; and
   forming a conductive layer conformally covering the chip front surface, each insulating sidewall, and the wafer front surface.

2. The method according to claim 1, wherein forming the insulating sidewalls on the sidewalls of the plurality of second chips comprises:
   forming an insulating layer conformally covering the plurality of second chips and the wafer front surface exposed between the plurality of second chips; and
   removing the insulating layer on the chip front surface of the each second chip and on the wafer front surface, thereby forming the insulating sidewalls on the sidewalls of the plurality of second chips.

3. The method according to claim 2, wherein removing the insulating layer on the chip front surface of the each second chip and on the wafer front surface includes a dry etching.

4. The method according to claim 2, wherein a thickness of the insulating layer is between about 0.1 micrometers and about 5 micrometers.

5. The method according to claim 2, wherein the insulating layer is made of a material including one of silicon nitride, silicon oxide, and silicon oxynitride.

6. The method according to claim 2, wherein the insulating layer is formed by a chemical vapor deposition method.

7. The method according to claim 1, wherein the insulating sidewalls completely expose the first electrode and the second electrode.

8. The method according to claim 1, wherein the conductive layer is made of one or more of materials including copper, aluminum, tin, and nickel.

9. The method according to claim 1, wherein the conductive layer is formed by a chemical vapor deposition method.

10. The method according to claim 1, wherein a thickness of the conductive layer is between about 0.1 micrometers and about 5 micrometers.

11. The method according to claim 1, further comprising: covering the conductive layer with an encapsulation layer after forming the conductive layer.

12. The method according to claim 1, wherein:
   providing the device wafer comprises: forming a first dielectric layer on the wafer front surface between the adjacent first chips;
   providing the plurality of second chips comprises: forming a second dielectric layer on the chip back surface of the each second chip; and
   bonding the chip back surface of the each second chip to a portion of the wafer front surface of the device wafer between the adjacent first chips comprises: bonding the first dielectric layer on the wafer front surface between the adjacent first chips and the second dielectric layer on the chip back surface.

13. The method according to claim 12, wherein bonding the first dielectric layer on the wafer front surface between the adjacent first chips and the second dielectric layer on the chip back surface includes a fusion bonding.

14. A wafer-level package structure, comprising:
   a device wafer that contains a plurality of first chips, wherein each first chip contains a first electrode, and the first electrode is exposed at a wafer front surface of the device wafer;
   a plurality of second chips, bonded to the wafer front surface, wherein a chip back surface of each second chip is bonded to a portion of the wafer front surface between adjacent first chips of the plurality of first chips, a surface opposite to the chip back surface is a chip front surface, and the each second chip contains a second electrode exposed at the chip front surface;
   insulating sidewalls on sidewalls of the plurality of second chips; and
   a conductive layer, conformally covering the chip front surface, each insulating sidewall, and the wafer front surface.

15. The structure according to claim 14, wherein the insulating sidewalls are made of a material including one of silicon nitride, silicon oxide, and silicon oxynitride.

16. The structure according to claim 14, wherein the conductive layer is made of one or more of materials including copper, aluminum, tin, and nickel.

17. The structure according to claim 14, wherein a thickness of the conductive layer is between about 0.1 micrometers and about 5 micrometers.

18. The structure according to claim 14, wherein a thickness of the insulating layer is between about 0.1 micrometers and about 5 micrometers.

19. The structure according to claim 14, further comprising: an encapsulation layer on the conductive layer.

20. The structure according to claim 14, further comprising:
   a first dielectric layer on the wafer front surface between the adjacent first chips; and
   a second dielectric layer on the chip back surface of the each second chip, bonded to the first dielectric layer.

* * * * *